US012640710B2

(12) United States Patent
Gao et al.

(10) Patent No.: US 12,640,710 B2
(45) Date of Patent: May 26, 2026

(54) ACTIVE RC-TYPE FILTER AND METHOD OF IMPLEMENTING AN ACTIVE RC-TYPE FILTER

(71) Applicant: NXP B.V., Eindhoven (NL)

(72) Inventors: Yuan Gao, Eindhoven (NL); Johannes Hubertus Antonius Brekelmans, Nederweert (NL); Harish Kundur Subramaniyan, Eindhoven (NL)

(73) Assignee: NXP B.V., Eindhoven (NL)

( * ) Notice: Subject to any disclaimer, the term of this patent is extended or adjusted under 35 U.S.C. 154(b) by 315 days.

(21) Appl. No.: 18/497,012

(22) Filed: Oct. 30, 2023

(65) Prior Publication Data

US 2024/0154604 A1 May 9, 2024

(30) Foreign Application Priority Data

Nov. 7, 2022 (EP) ..................................... 22205916

(51) Int. Cl.
| *H03H 11/12* | (2006.01) |
| *G01S 13/34* | (2006.01) |

(52) U.S. Cl.
CPC ......... *H03H 11/1217* (2013.01); *G01S 13/34* (2013.01)

(58) Field of Classification Search
CPC ......... H03H 11/1217; H03H 2210/028; H03H 2210/036; H03H 11/126; G01S 13/34
See application file for complete search history.

(56) References Cited

U.S. PATENT DOCUMENTS

| 5,006,735 | A | 4/1991 | Taylor |
| 8,143,934 | B1 * | 3/2012 | Shutt .................... H03K 17/063 |
| | | | 327/437 |
| 9,673,782 | B1 | 6/2017 | Andrabi et al. |
| 9,948,279 | B1 | 4/2018 | Chen et al. |
| 11,500,060 | B2 * | 11/2022 | Herzinger .............. G01S 7/352 |

(Continued)

FOREIGN PATENT DOCUMENTS

WO      2007145615 A1    12/2007

OTHER PUBLICATIONS

Hwang, J., "Active-RC channel selection filter tunable from 6kHz to 18MHz for software-defined radio", 2005 IEEE International Symposium on Circuits and Systems (ISCAS), May 23-26, 2005.

(Continued)

*Primary Examiner* — William Kelleher
*Assistant Examiner* — Ismaaeel A. Siddiquee

(57) ABSTRACT

In accordance with a first aspect of the present disclosure, an active RC-type filter is provided, comprising: an input, an output and a signal path between said input and output; at least one capacitor bank and at least one resistor bank, wherein said capacitor bank and resistor bank are integrated into the signal path; wherein the resistor bank comprises a plurality of resistor ladders; wherein each one of said resistor ladders comprises a plurality of resistors connected in series; wherein each one of said resistors has an input node configured to be coupled selectively to the signal path through one of a plurality of controllable switches; and wherein said resistor ladders have output nodes directly coupled to each other and to the signal path. In accordance with a second aspect of the present disclosure, a corresponding method of implementing an active RC-type filter is conceived.

7 Claims, 12 Drawing Sheets

(56)     References Cited

U.S. PATENT DOCUMENTS

| | | | | |
|---|---|---|---|---|
| 11,799,491 | B1 * | 10/2023 | Woo ...................... | H03M 1/124 |
| 2002/0140522 | A1 * | 10/2002 | Martin ..................... | H03H 7/25 |
| | | | | 333/172 |
| 2005/0242872 | A1 | 11/2005 | Lou et al. | |
| 2005/0242873 | A1 * | 11/2005 | Chen ................... | H03H 11/1291 |
| | | | | 327/553 |
| 2006/0186952 | A1 * | 8/2006 | Lou .................... | H03H 11/1291 |
| | | | | 327/553 |
| 2007/0236281 | A1 * | 10/2007 | Cicalini .................. | H03H 1/02 |
| | | | | 327/553 |
| 2014/0002285 | A1 * | 1/2014 | Cho .................... | H03M 1/1009 |
| | | | | 341/120 |

OTHER PUBLICATIONS

Texas Instruments, "AWR1843 Single-Chip 77- to 79-GHz FMCW Radar Sensor", Product Sheet, SWRS222B—Dec. 2018—Revised Apr. 2020.

Wang, W., "A Wide Tuning Range Active-RC Filter for Multi-Mode Applications", 2010 10th IEEE International Conference on Solid-State and Integrated Circuit Technology, Nov. 1-4, 2010.

Ye, L., "Widely Reconfigurable 8th-Order Chebyshev Analog Baseband IC with Proposed Push-Pull Op-amp for Software-Defined Radio in 65nm CMOS", 2012 IEEE International Symposium on Circuits and Systems (ISCAS), May 20-23, 2012.

* cited by examiner

700

800

900

1000

1100

1200

1300

• Calibrating filter stage 1
  - Calibrate fHP_3dB_stage1 = 1/(2pi*Rf1*Cf1)
    • Calibrate Rf1: ① (wide range, coarse grid)
    • Calibrate Cf1: ② (narrow range, fine grid)
  - Calibrate G_dB_stage1 = 20*log10(Cin1/Cf1)
    • Calibrate Cin1: ③
• Calibrating filter stage 1
  - Calibrate fHP_3dB_stage2 = 1/(2pi*Rf2*Cf2)
    • Calibrate Rf2: ④ (wide range, coarse grid)
    • Calibrate Cf2: ⑤ (narrow range, fine grid)
  - Calibrate G_dB_stage2 = 20*log10(Cin2/Cf2)
    • Calibrate Cin2: ⑥
  - Calibrate fLP_3dB_stage2 = 1/(2pi*Cin2*Rlpf)
    • Calibrate Rlpf: ⑦

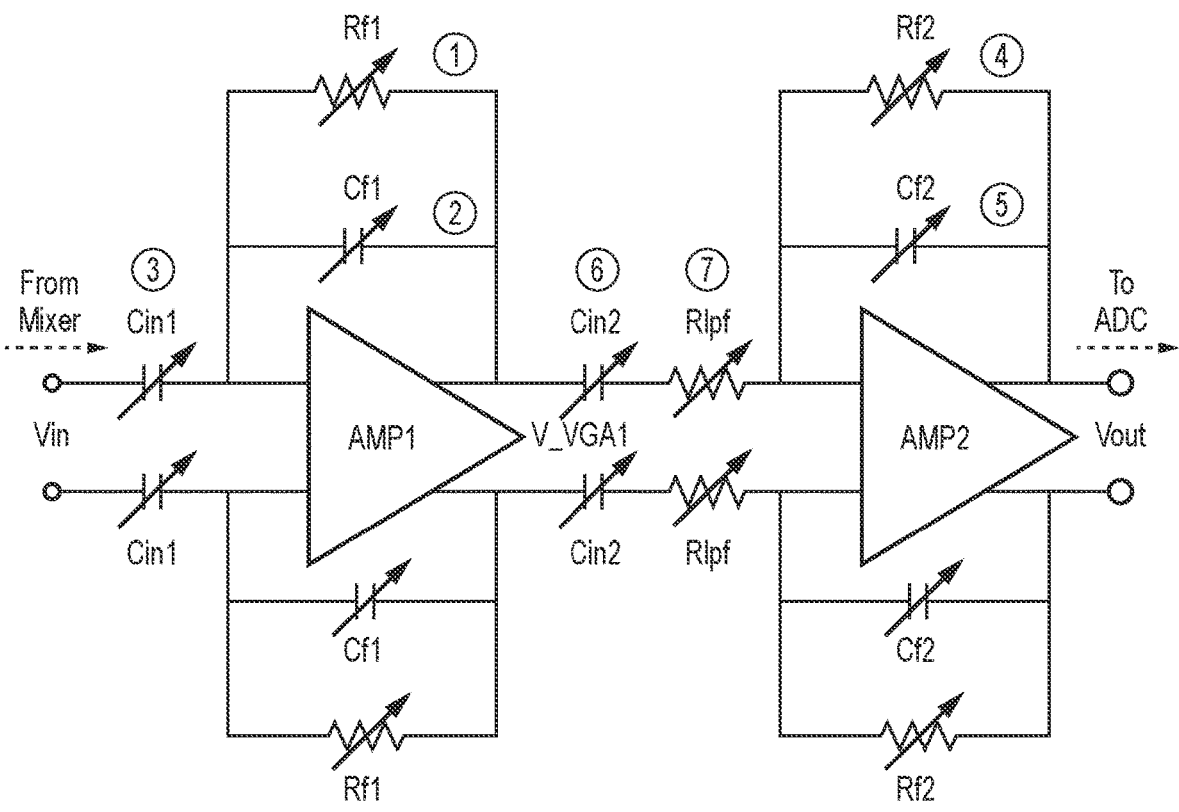

FIG. 13

ACTIVE RC-TYPE FILTER AND METHOD OF IMPLEMENTING AN ACTIVE RC-TYPE FILTER

CROSS-REFERENCE TO RELATED APPLICATIONS

This application claims the priority under 35 U.S.C. § 119 of European Patent application no. 22205916.4, filed on 7 Nov. 2022, the contents of which are incorporated by reference herein.

TECHNICAL FIELD

The present disclosure relates to an active RC-type filter. Furthermore, the present disclosure relates to a corresponding method of implementing an active RC-type filter.

BACKGROUND

Active RC-type filters may be used in various applications. For example, a frequency-modulated continuous wave (FMCW) radar device may use a receiver section that includes a low-noise amplifier (LNA), a mixer, a base-band amplifier/filter and an analog-to-digital converter (ADC) to receive a reflected radar signal.

SUMMARY

In accordance with a first aspect of the present disclosure, an active RC-type filter is provided, comprising: an input, an output and a signal path between said input and output; at least one capacitor bank and at least one resistor bank, wherein said capacitor bank and resistor bank are integrated into the signal path; wherein the resistor bank comprises a plurality of resistor ladders; wherein each one of said resistor ladders comprises a plurality of resistors connected in series; wherein each one of said resistors has an input node configured to be coupled selectively to the signal path through one of a plurality of controllable switches; and wherein said resistor ladders have output nodes directly coupled to each other and to the signal path.

In one or more embodiments, one or more of the plurality of controllable switches are implemented as T-switches.

In one or more embodiments, the active RC-type filter further comprises at least one amplifier, wherein the input node of the first one of the resistors of each resistor ladder is coupled to an input of said amplifier, and wherein the output node of each resistor ladder is coupled to an output of said amplifier.

In one or more embodiments, an integrated circuit comprises an active RC-type filter of the kind set forth, and the integrated circuit further comprises a calibration controller configured to calibrate a coarse resolution bank of the active RC-type filter before a fine resolution bank of the active RC-type filter.

In one or more embodiments, the coarse resolution bank is the resistor bank and the fine resolution bank is the capacitor bank.

In one or more embodiments, the coarse resolution bank is the capacitor bank and the fine resolution bank is the resistor bank.

In one or more embodiments, an integrated circuit comprises an active RC-type filter of the kind set forth, wherein the active RC-type filter further comprises: a first amplifier, a first capacitor bank coupled to an input and output of the first amplifier, and a first resistor bank coupled to said input and output of the first amplifier; a second amplifier, a second capacitor bank coupled to an input and output of the second amplifier, and a second resistor bank coupled to said input and output of the second amplifier; wherein the integrated circuit further comprises a calibration controller configured to calibrate the first amplifier by searching for optimal values for the first capacitor bank and the first resistor bank, and to calibrate the second amplifier by searching for optimal values for the second capacitor bank and the second resistor bank.

In one or more embodiments, the input of the active RC-type filter is coupled to an output of a mixer and the output of the active RC-type filter is coupled to an input of an analog-to-digital converter.

In one or more embodiments, the active RC-type filter is an intermediate frequency (IF) active RC-type filter configured to receive an IF signal from the mixer.

In one or more embodiments, an integrated circuit for use in radar applications, in particular a frequency-modulated continuous wave radar device, comprises an active RC-type filter of the kind set forth.

In accordance with a second aspect of the present disclosure, a method of implementing an active RC-type filter is conceived, the method comprising: providing the active RC-type filter with an input, an output and a signal path between said input and output; providing the active RC-type filter with at least one capacitor bank and at least one resistor bank, wherein said capacitor bank and resistor bank are integrated into the signal path; wherein the resistor bank comprises a plurality of resistor ladders; wherein each one of said resistor ladders comprises a plurality of resistors connected in series; wherein each one of said resistors has an input node configured to be coupled selectively to the signal path through one of a plurality of controllable switches; and wherein said resistor ladders have output nodes directly coupled to each other and to the signal path.

In one or more embodiments, one or more of the plurality of controllable switches are implemented as T-switches.

In one or more embodiments, the method further comprises providing the active RC-type filter with at least one amplifier, wherein the input node of the first one of the resistors of each resistor ladder is coupled to an input of said amplifier, and wherein the output node of each resistor ladder is coupled to an output of said amplifier.

In one or more embodiments, the active RC-type filter is an intermediate frequency (IF) active RC-type filter.

In one or more embodiments, the method further comprises coupling the input of the active RC-type filter to an output of a mixer and coupling the output of the active RC-type filter to an input of an analog-to-digital converter.

DESCRIPTION OF DRAWINGS

Embodiments will be described in more detail with reference to the appended drawings.

FIG. 13 shows an illustrative embodiment of a calibration sequence.

DESCRIPTION OF EMBODIMENTS

Active RC-type filters may be used in various applications. For example, a frequency-modulated continuous wave (FMCW) radar device may use a receiver section that includes a low-noise amplifier (LNA), a mixer, a base-band amplifier/filter and an analog-to-digital converter (ADC) to receive a reflected radar signal.

Figure 2:
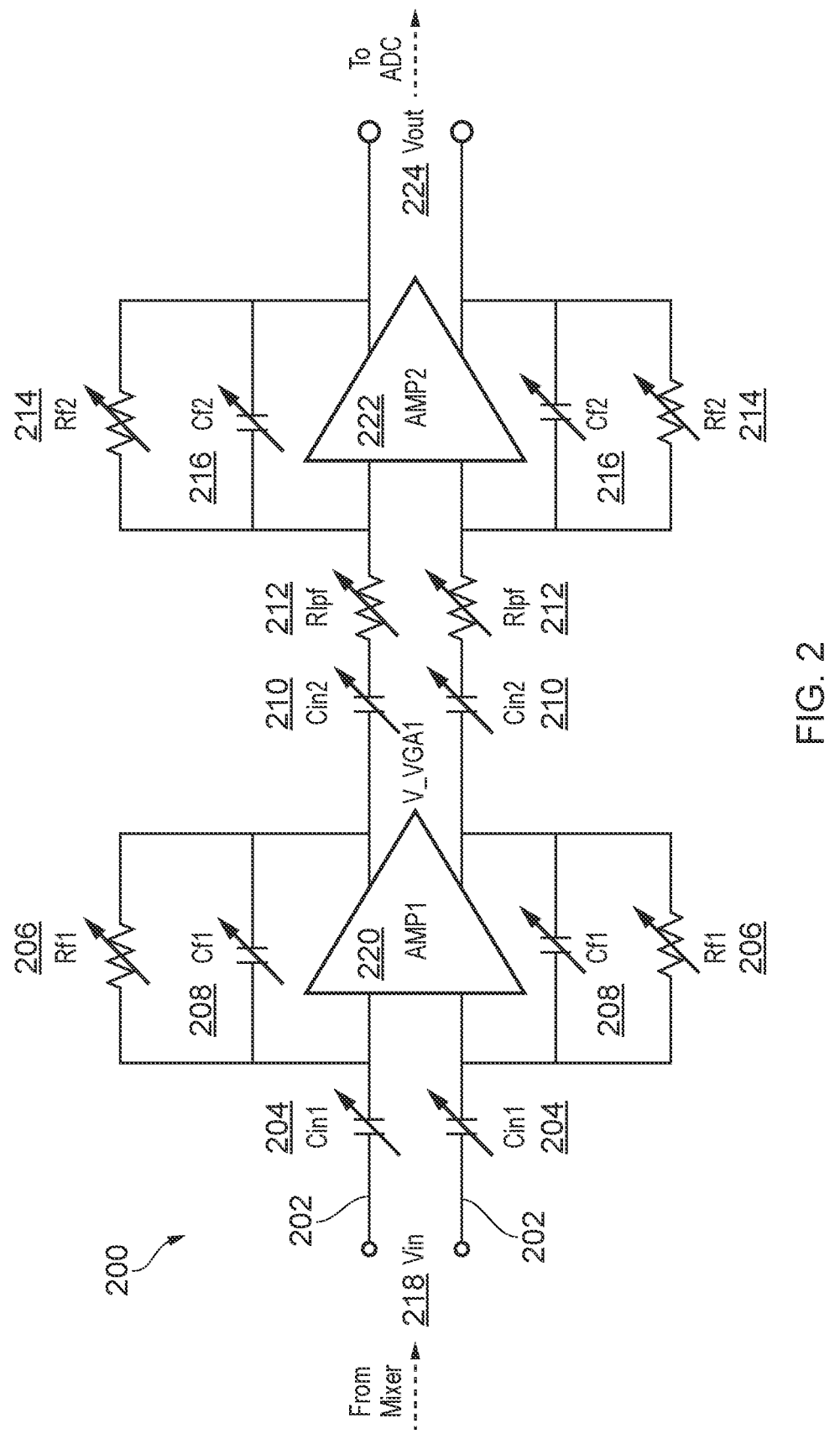
FIG. 2 shows an example of a 2 stage active RC-type filter.

Characteristic for a received FMCW radar signal is an uneven spectral distribution, with low frequency spectral content having a relatively higher power and frequencies of interest, situated in the higher part of spectrum, having a lower power. To correct for this typical characteristic the active RC-type filter typically consists of several combined high-pass/low-pass filter stages that equalize the spectral content, so that the available dynamic range of a subsequent ADC can be maximally exploited, e.g. to allow weak signals to be detected from targets masked by the high levels of mainly low-frequency signal content. The IF filters can be filters of an active RC-type (as shown in FIG. 2), which need to be tunable to adapt to specific requirements of the radar system and to remove influences of the integrated circuit (IC) manufacturing spread and silicon operating temperature. The filters are typically tuned in discrete steps. As a result, many passive components may be needed to implement these steps, taking up a lot of silicon area.

Figure 1A:
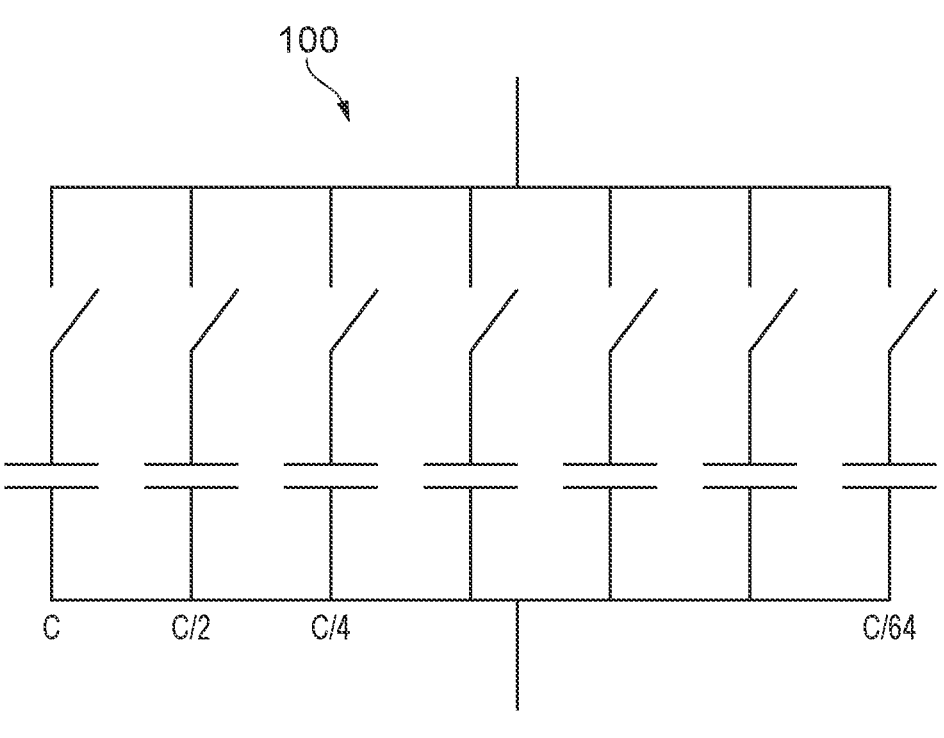
FIG. 1A shows an example of a capacitor that can be varied in discrete steps.
Figure 1B:
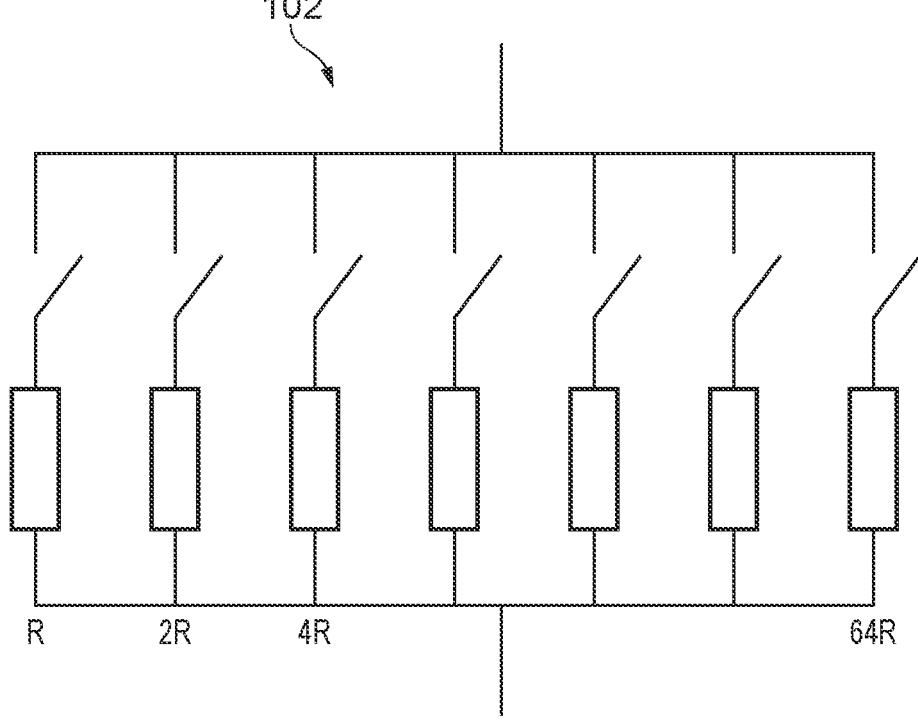
FIG. 1B shows an example of a resistor that can be varied in discrete steps.

FIGS. 1A and 1B show examples of a discretely variable capacitor 100 and a discretely variable resistor 102, respectively. The variable capacitor 100 and variable resistor can be implemented as so-called binary banks. A binary bank is well known and offers the most area-efficient implementation for the variable capacitor 100. More specifically, for a nominal capacitance of C and for example a 7-bits resolution a total capacitance (i.e., silicon area) approximating 2C is needed. However, for the variable resistor 102 the opposite holds: a 7-bit binary bank with a nominal resistance of R needs 2^7=127 unit resistors and thus consumes an area needed to place 127 unit resistors.

FIG. 2 shows an example of a 2 stage active RC-type filter 200. The active RC-type filter 200 comprises a signal path 202 between an input 218 and an output 224 of the active RC-type filter 200. Furthermore, this exemplary active RC-type filter comprises two fixed gain amplifiers 220, 222. Capacitors 204, 208, 210, 216 and resistors 206, 212, 214 are integrated into the signal path 202. It is noted that the active RC-type filter 200 contains a plurality of amplifiers 220, 222, associated capacitor banks 204, 208, 210, 216 and resistor banks 206, 212, 214, but in accordance with the present disclosure only a single amplifier, capacitance bank and resistor bank may suffice. It is noted that FIG. 2 shows an example, in which the active RC-type filter 200 contains several components Cin1, Cf1, Rf1, Cin2, Rlpf, Cf2 and Rf2. However, the skilled person will appreciate that the active RC-type filter 200 may also have less or more components. For instance, the active RC-type filter 200 shown in FIG. 2 has two gain stages in a cascade arrangement. In practice, the active RC-type filter 200 may contain only a single stage or more than two stages.

For the active RC-type filter 200 shown in FIG. 2 a complex transfer function can be derived as shown in equation 1. Furthermore, the relationship between $\phi$(Vin), $\phi$(V_VGA1) and $\phi$(Vout) is shown in equations 2 and 3. In the equations, variable j refers to the imaginary unit of the complex values, and radial frequency $\omega$ refers to $2*\pi*f$.

$$\frac{Vout}{Vin} = \left\{ \frac{Cin1}{Cf1} \cdot \frac{j\omega \cdot Cf1 \cdot Rf1}{1 + j\omega \cdot Cf1 \cdot Rf1} \right\} \cdot \qquad \text{(Eq. 1)}$$

$$\left\{ \frac{1}{1 + j\omega \cdot Cin2 \cdot Rlpf} \right\} \cdot \left\{ \frac{Cin2}{Cf2} \cdot \frac{j\omega \cdot Cf2 \cdot Rf2}{1 + j\omega \cdot Cf2 \cdot Rf2} \right\}$$

$$\phi(V\_AMP1) - \phi(Vin) = -\frac{\pi}{2} - \arctan(\omega \cdot Rf1 \cdot Cf1) \qquad \text{(Eq. 2)}$$

$$\phi(Vout) - \phi(V\_AMP1) = \qquad \text{(Eq. 3)}$$

$$\arctan\left(\frac{\omega \cdot Cin2}{Rlpf}\right) - \pi - \arctan(\omega \cdot Rf2 \cdot Cf2)$$

Figure 3:
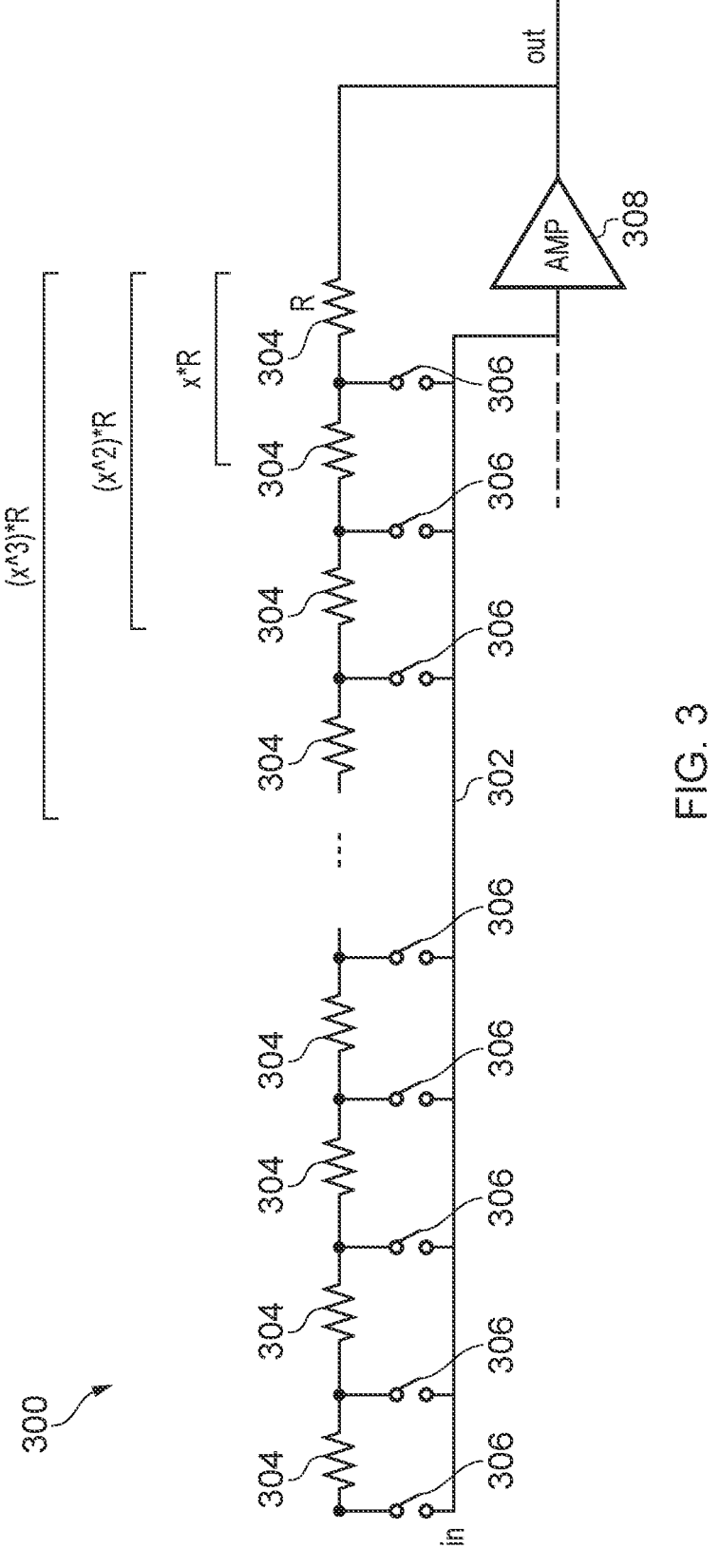
FIG. 3 shows an example of a resistor bank feedback network with ideal switches used as feedback element around an inverting amplifier.

FIG. 3 shows an example of a resistor bank feedback network 300 with ideal switches 306 used as feedback element around an inverting amplifier 308. In particular, the resistor bank 300 is a more detailed representation of the resistor bank 206 or the resistor bank 214 shown in FIG. 2. It is noted that FIG. 2 shows the differential implementation of the active RC-type filter, while the circuitry in FIG. 3 shows only one half of the differential circuit. In operation, only one of the switches 306 of the resistor bank 300 will be closed while all other switches are open. A fixed gain amplifier 308 is provided between the input and the output. The resistor bank 300 comprises a plurality of resistors 304. The resistors 304 can be coupled selectively to the signal path 302 through a plurality of controllable switches 306, which are connected to the input nodes of the resistors 304. The resistors 304 are connected to each other in series. Compared to a parallel connection, a series connection occupies a smaller silicon area. For example, in order to obtain four selections from 1R to 4R, the approach of a series connection would be to connect four resistors whose values are 1R in series. The total area is four times the area of an 1R resistor, which is close to the area of a 4R resistor. Meanwhile, if implemented in a parallel fashion, the approach would be to connect four 4R resistors in parallel. The area needed is therefore four times the area of a 4R resistor. In this comparison, the area of a series implementation is ¼ of the area of a parallel implementation. When the ratio needed is for example 100, the area advantage of the series approach would be ¹⁄₁₀₀ of the parallel approach. Therefore, in order to achieve the large Rmax/Rmin ratio given the area constraint, the topology of a series connection instead of a parallel connection is chosen. A second order effect, which is also a challenge to tackle, is that if dozens of switches load the resistor ladder as shown in FIG. 3, the linearity of the active RC-type filter together with the feedback network would be bottlenecked by the feedback network, as explained in more detail below.

Figure 4:
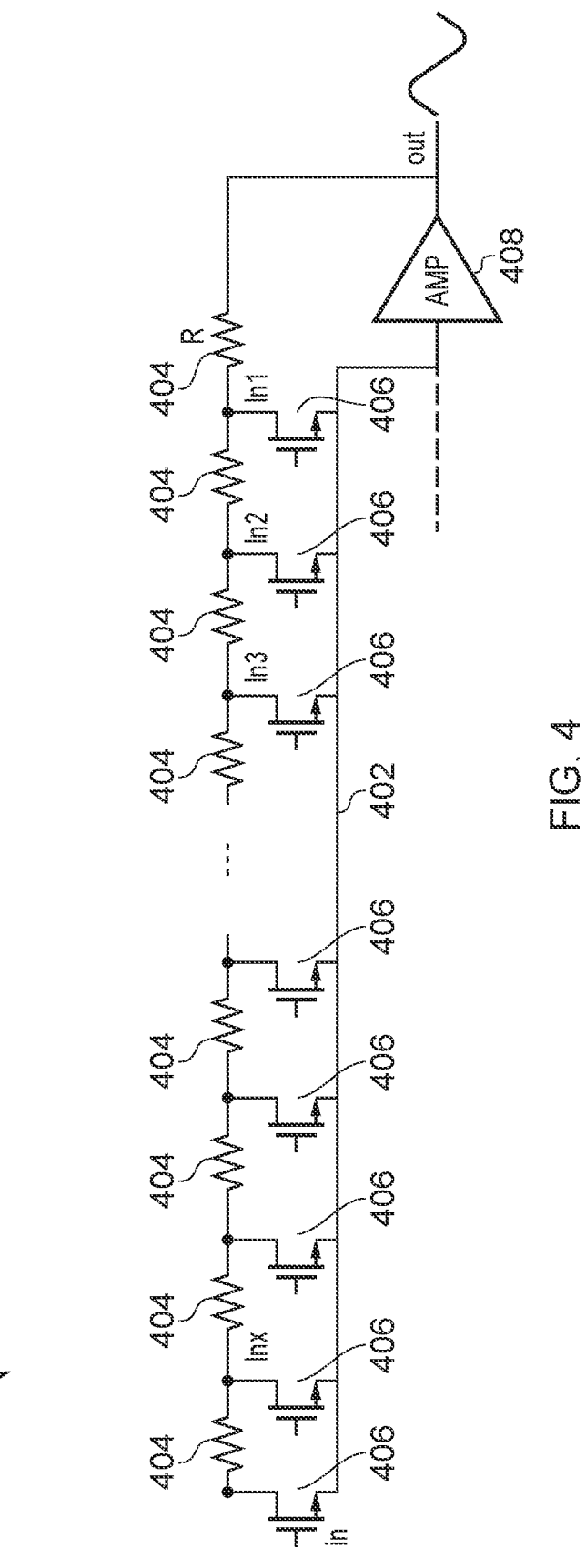
FIG. 4 shows an example of a resistor bank feedback network using MOS devices as switches.

FIG. 4 shows an example of a resistor bank feedback network 400 using MOS devices as switches. In particular, FIG. 4 shows the same resistor bank implementation as FIG. 3, except that the ideal switches are now replaced by MOS devices. As mentioned above, compared to a parallel connection, a series connection occupies a smaller silicon area. However, in the arrangement shown in FIG. 4, the most left switch is closed, configuring the resistor ladder at its maximum value. All the other switches are in a supposedly off-state. A few factors make the residual current flowing through these supposedly off-branches non-negligible compared to the on-branch. First, in smaller technology nodes, the transistors tend to be more leaky, which means that in open position they still conduct a little bit of current (i.e., Roff is not infinite). Due to the large Rmax/Rmin ratio requirement that should be fulfilled by the resistor ladder, the minimum-resistor branch can be $\frac{1}{100}\times$ compared to the maximum-resistor branch. Provided a realistic 10% of switch on-resistance compared to the desired resistance in the minimum-resistor branch, and a realistic Roff/Ron ratio of 1e6, then the residual conductance of the minimum-resistor branch would be $\frac{1}{100}\times$ the conductance from the enabled branch. When summing the residual conductance from all the supposedly off branches, the summation can be within one order of magnitude compared to the desired conductance. It is noted that the residual conductance is highly non-linear, more so when excited by a large signal swing at its two ends. So, effectively, the resistor ladder would have a desired linear conductance in parallel with a significant nonlinear conductance. As a result, the linearity of the active RC-type filter and feedback network combined may be bottlenecked by the feedback network.

Figure 5:
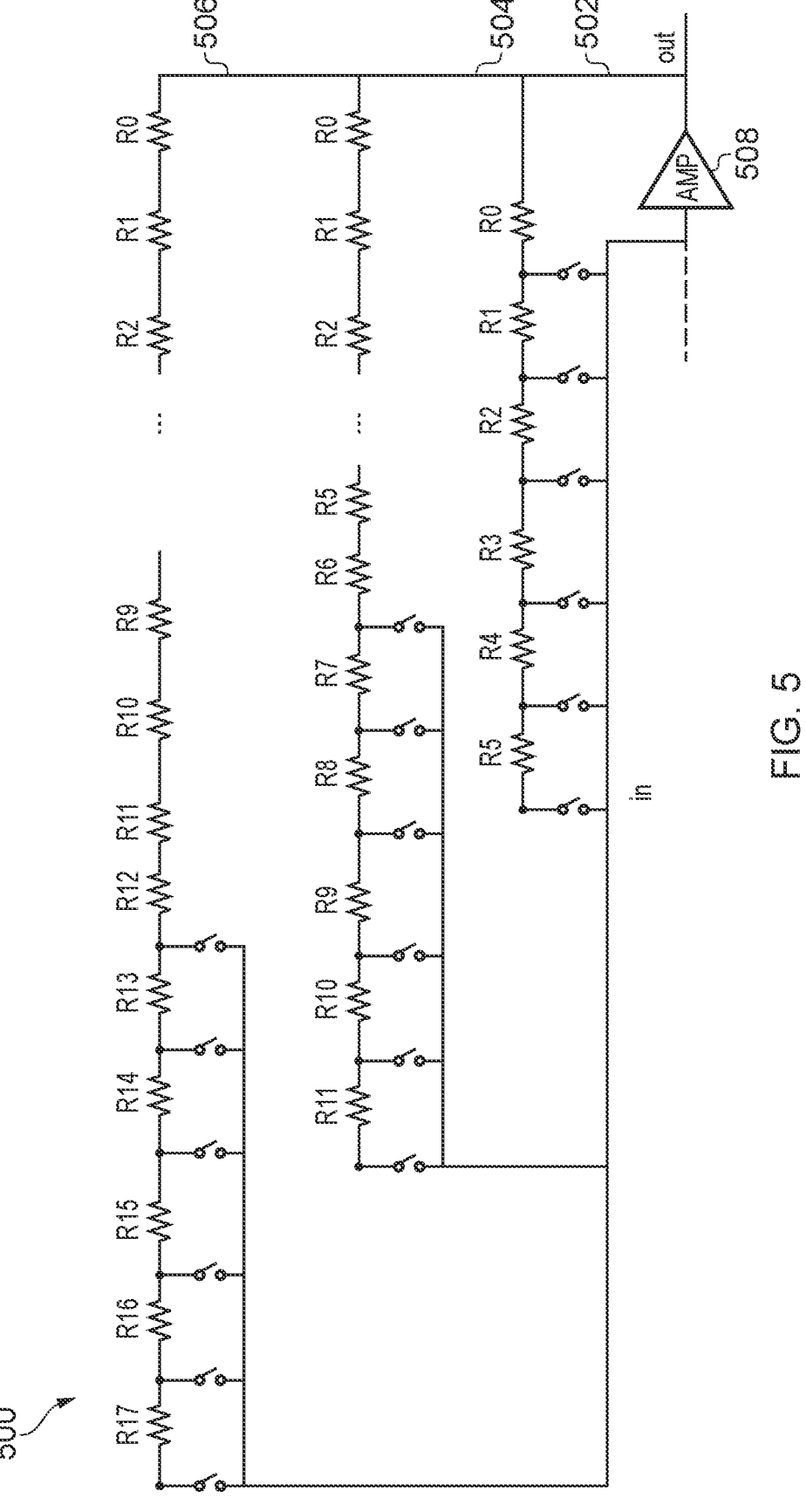
FIG. 5 shows an illustrative embodiment of a resistor bank feedback network with ideal switches used as feedback element around an inverting amplifier.

FIG. 5 shows an illustrative embodiment of a resistor bank feedback network 500 with ideal switches used as feedback element around an inverting amplifier 508, which facilitates solving the linearity weakness. The resistor bank 500 may be included in an active RC-type filter as shown in FIG. 2, to implement the resistor bank 206, resistor bank 214, and/or another resistor, such as resistor 212. The resistor bank 500 comprises a plurality of resistor ladders 502, 504, 506. Each resistor ladder 502, 504, 506 comprises a plurality of resistors connected in series. Furthermore, each one of said resistors has an input node configured to be coupled selectively to the signal path through a controllable switch. Furthermore, the resistor ladders 502, 504, 506 resistor ladders have output nodes directly coupled to each other and to the signal path. The topology shown in FIG. 5 facilitates achieving that the active RC-type filter can filter signals with a large amplitude, while keeping the distortion caused by the controllable switches at an acceptable level. In particular, dividing the resistor ladder network in sub-ladders reduces the distortion caused by the loading of the network by the switches in the off state. It is noted that, although FIG. 5 shows three parallel sub-ladders 502, 504, 506, any number of sub-ladders may be implemented, depending on the requirements. Furthermore, it is noted that the first sub-ladder 502 implements the lower range of the resistance value, the second sub-ladder 504 is a continuation of the first sub-ladder 502 and delivers the medium range of the resistance value, and the third sub-ladder 506 is a continuation of the second sub-ladder 504 and delivers the high range of the resistance value. Finally, it is noted that it is not strictly necessary that only one switch is closed in the resistor bank 500. In particular, more than one switch may be closed to obtain an "off-grid" resistor value.

Accordingly, instead of loading dozens of transistors in a single ladder, both the ladder and the switches are divided into several groups, so that each smaller ladder is loaded with less switches. In this example, depending on the resistance value needed, no matter whether the enabled switch path is in the top, middle or bottom row, each row is loaded with a maximum of 6 switches.

The capacitor banks, on the other hand, may have a standard design. In particular, they may be designed to provide a relatively low ratio that is below 10 while providing very small steps. The resistor Rlpf shown in FIG. 2, which may be the last component that is calibrated, also has a relatively low range but with small steps. Furthermore, to avoid that the sum of all non-linear currents caused by the switches in the off state creates significant distortion, the switches may be implemented as T-switches. Thereby, the non-linear current in the supposedly off branches are shorted to AC ground instead of the input of the active RC-type filter.

Figure 6:
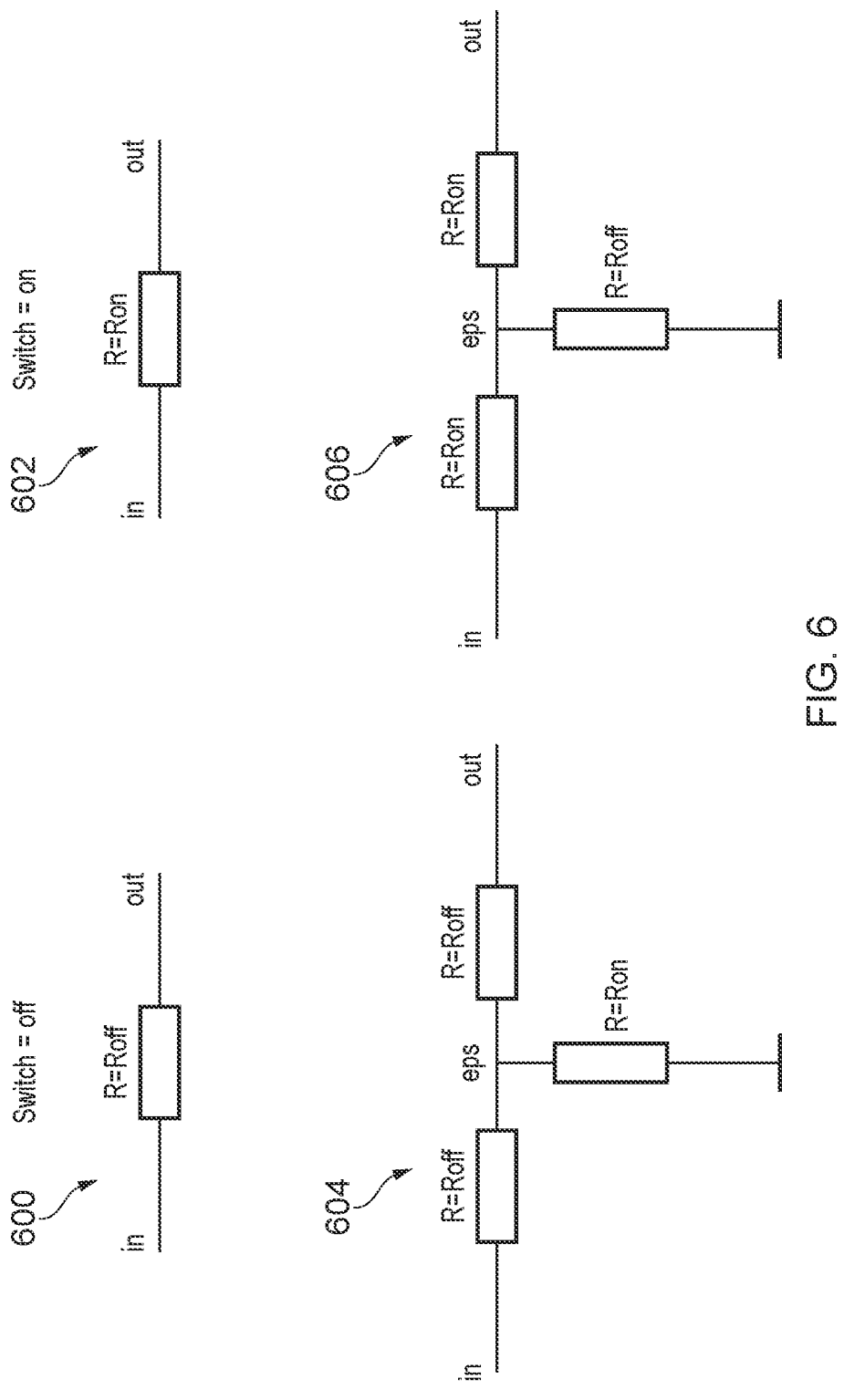
FIG. 6 shows an equivalent circuit of different types of switches in the off state and the on state.
Figure 7:
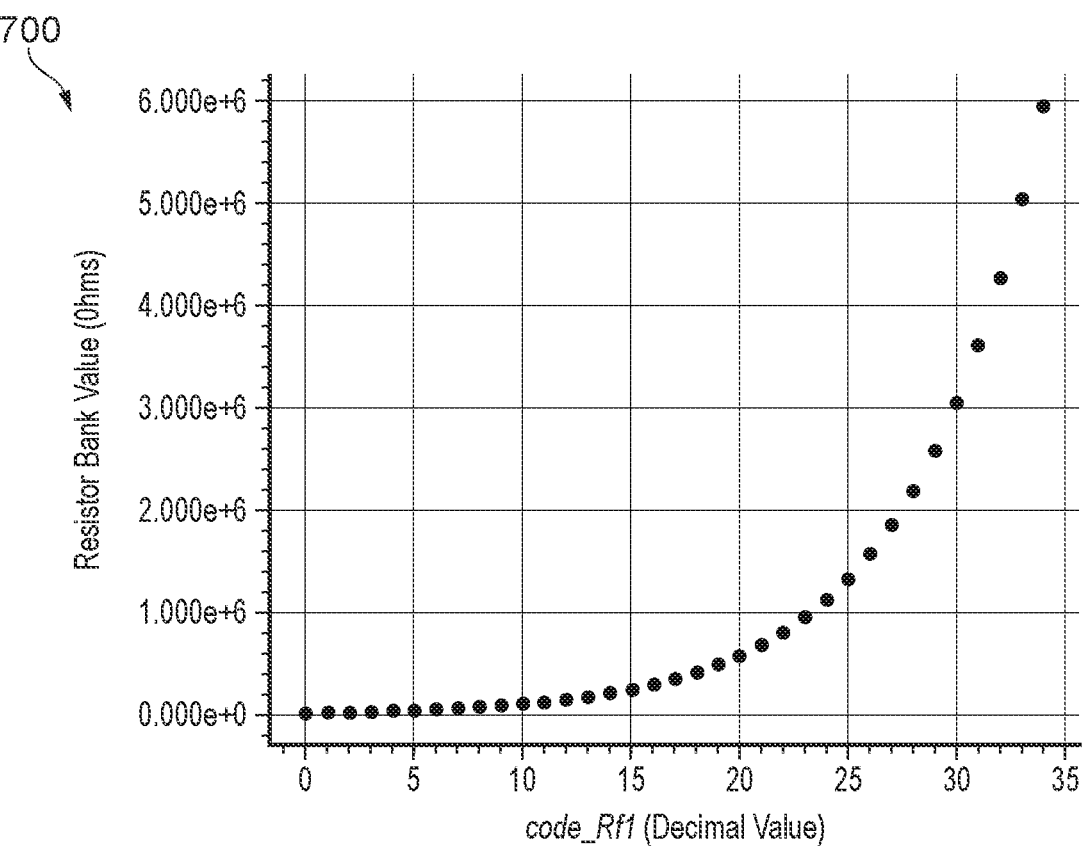
FIG. 7 shows a dependency between a programming code and a resistor bank value.
Figure 8:
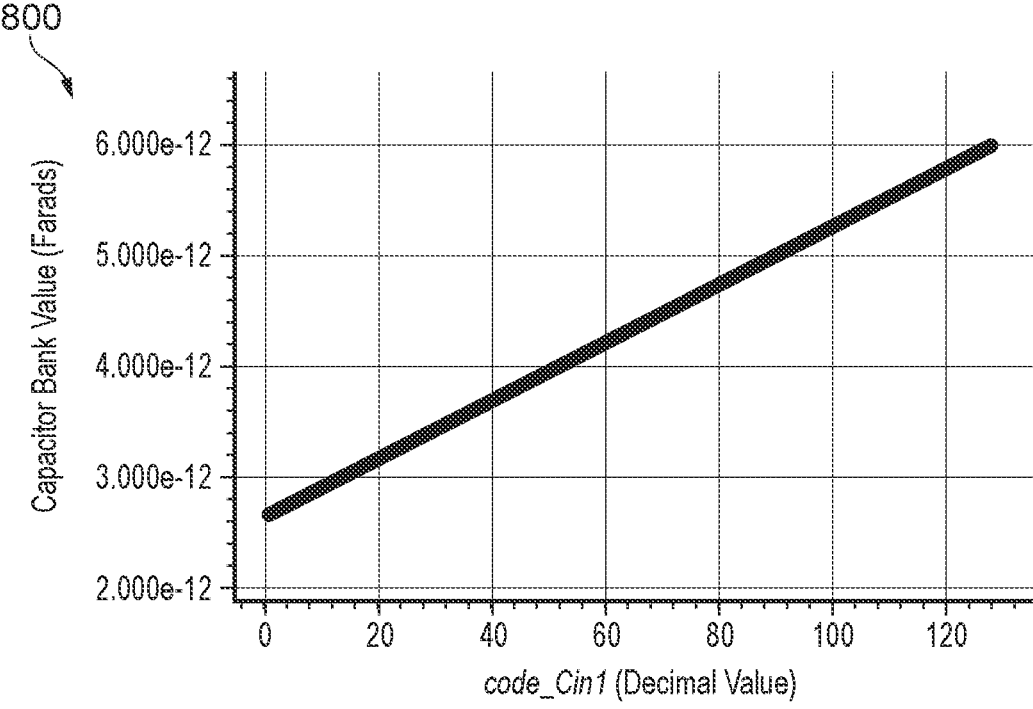
FIG. 8 shows a dependency between a programming code and a capacitor bank value.
Figure 9:
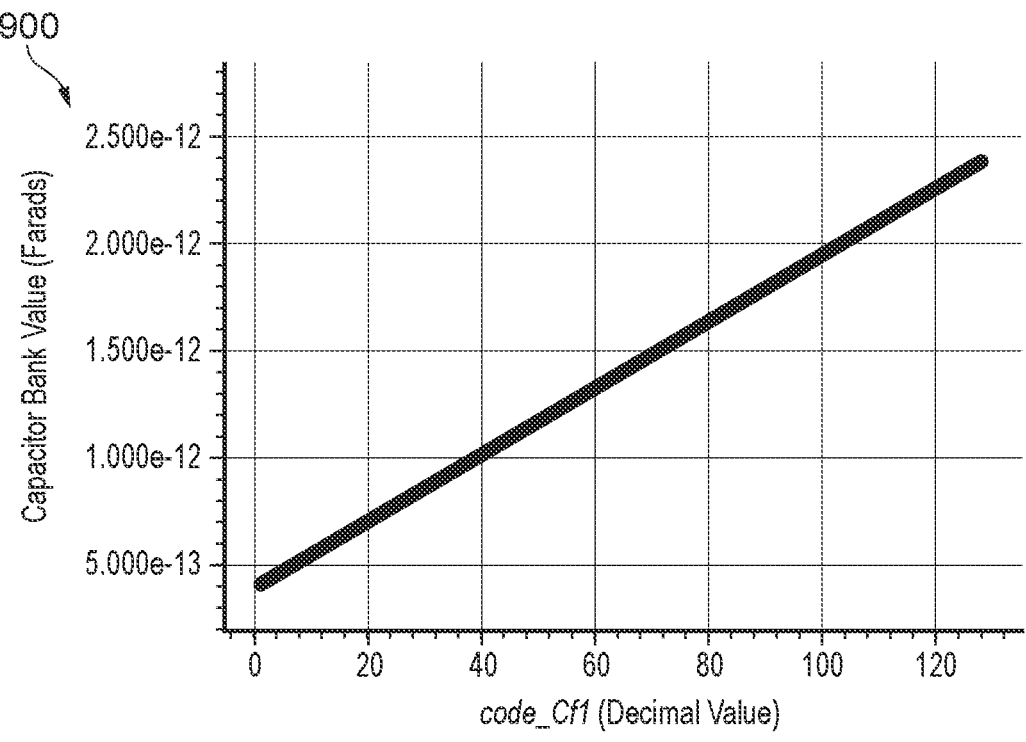
FIG. 9 shows a dependency between a programming code and a capacitor bank value.
Figure 10:
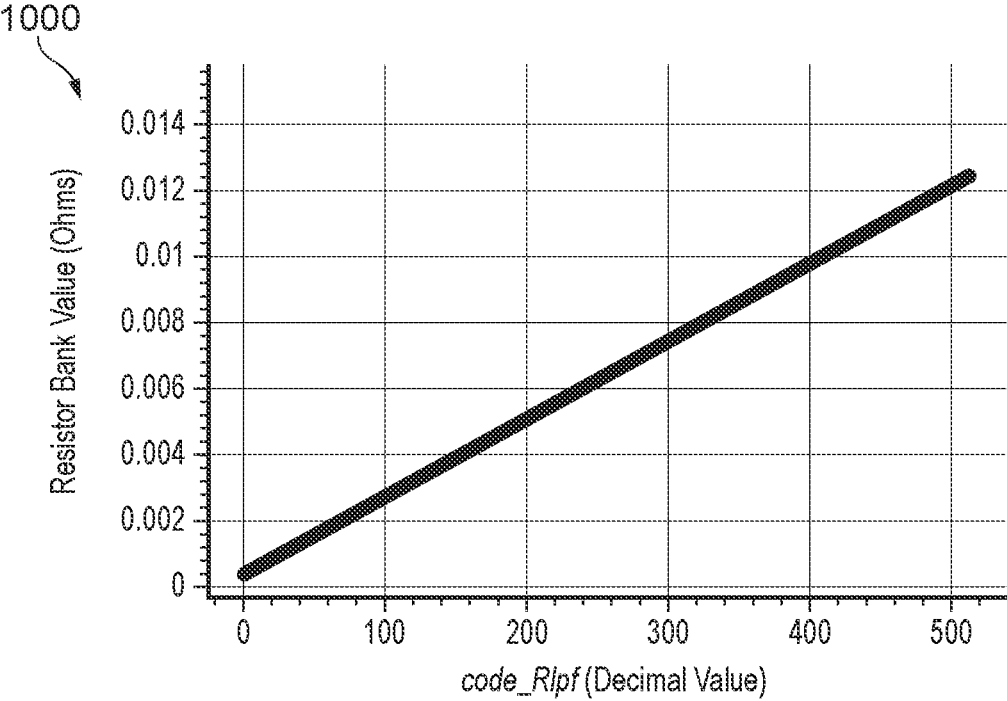
FIG. 10 shows a dependency between a programming code and a resistor bank value.

FIG. 6 shows the simplified equivalent circuit of different types of switches 600, 602, 604, 606 in the off state and the on state. In particular, FIG. 6 shows an ordinary switch in an off state 600, an ordinary switch in an on state 602, a T-switch in an off state 604, and a T-switch in an on state 606. The T-switch 604, 606 uses more components to improve the isolation between the input and output in the off state. Towards node out the T-switch still behaves as a non-ideal switch, but as a result of the intermediate node eps the signal passing from the input to the output is an order of magnitude smaller compared to the ordinary switch 600, 602. As mentioned above, the use of T-switches in a resistor bank of the kind set forth facilitates avoiding that the sum of all non-linear currents caused by the switches in the off state creates significant distortion.

It is noted that the presently disclosed active RC-type filter may have several additional advantages. For instance, instead of providing only a fixed, limited set of settings, the presently disclosed active RC-type filter may meet the required filter profile requirements of different customers with the same silicon design. It is noted that the term "profile" refers to a profile of operation. More specifically, the term refers to the various filter transfer functions provided by a chip, which are available for choice on a system level. Furthermore, the presently disclosed active RC-type filter may change the way of how programming the transfer function is approached. This approach may offer a more direct and precise control regarding programming the magnitude and cut-off frequency. The typical approach is to first enable a certain branch of the hardware, depending on the profile number. Then, the trimming word for R and C within this branch is retrieved from a global setting. This typical approach does not lend itself to change the gain or cut-off corner freely. The approach facilitated by the presently disclosed active RC-type filter may adjust the R and C until the gain and cut-off corner are close enough to the specified values. This can also be used to modulate the gain and phase of the receiver. In short, this approach is backward compatible with the typical approach while opening opportunities to provide more features. An implementation of the approach will be explained with reference to FIGS. 13 to 15.

When using reconfigurable resistor and capacitor banks in radar applications, it may be difficult to achieve both a wide control range and a relatively high accuracy of metrics such as gain and cut-off corner. In order to address this, the presently disclosed approach may assign the fulfillment of the requirement of a wide control range to components that are calibrated first, while it may assign the fulfillment of the accuracy requirement to components which are calibrated later. In this way it is exploited that components that need to vary over a large range may have a relaxed accuracy requirement, while components that should provide high accuracy can have a relaxed control range requirement. For instance, the resistors Rf1 and Rf2 may be assigned to be wide range with large steps. Thus, the resistor bank may be calibrated before the capacitor bank, to facilitate obtaining both a wide dynamic range and a relatively low quantization error of metrics such as gain and cut-off corner.

FIGS. 7 to 10 show different diagrams, illustrating that the presently disclosed active RC-type filter is able to meet given requirements. In particular, code_Rf1, code_Cin1, etc. are digital codes represented here in decimal format, which determine the analog value of their analog counterparts. For example:

Cin1=(Cin1_design_min+
    Cin1_design_step*code_Cin1);
Cf1=(Cf1_design_min+Cf1_design_step*code_Cf1);
Rf1=(Rf1_design_min*ratio^(code_Rf1));
Glpf=Glpf_design_min+Glpf_design_step*code_Rlpf.

Figure 11:
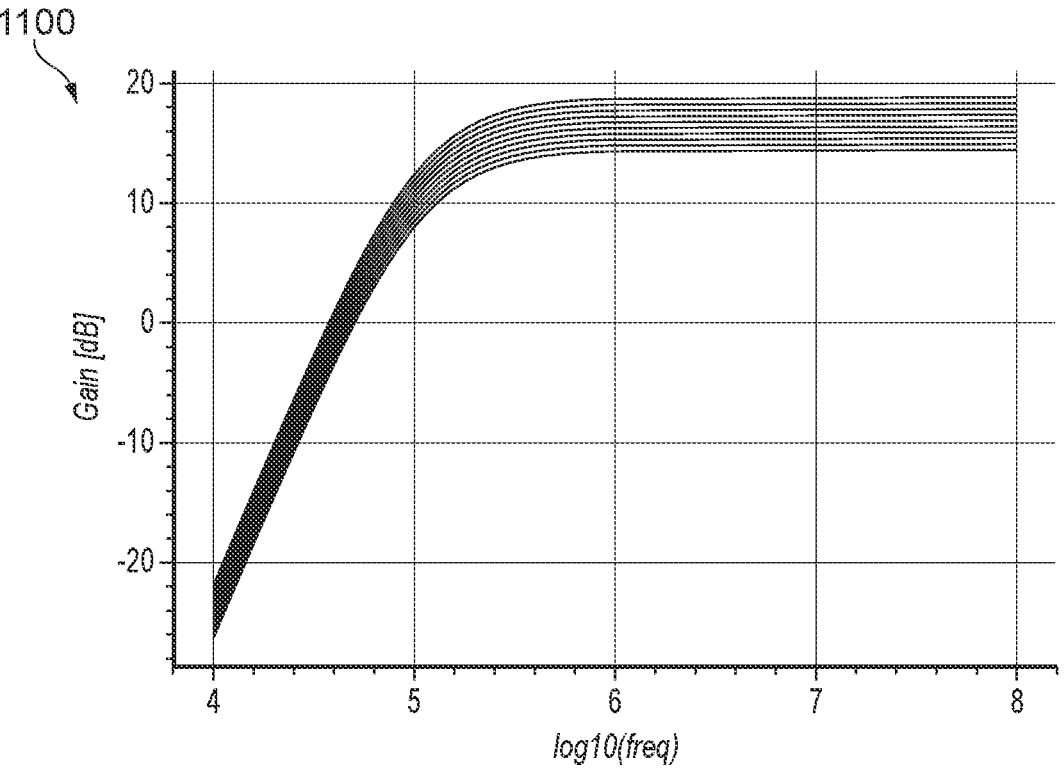
FIG. 11 shows a diagram illustrating the filter transfer function magnitude as function of frequency for different programming codes that alter the amount of gain.
Figure 12:
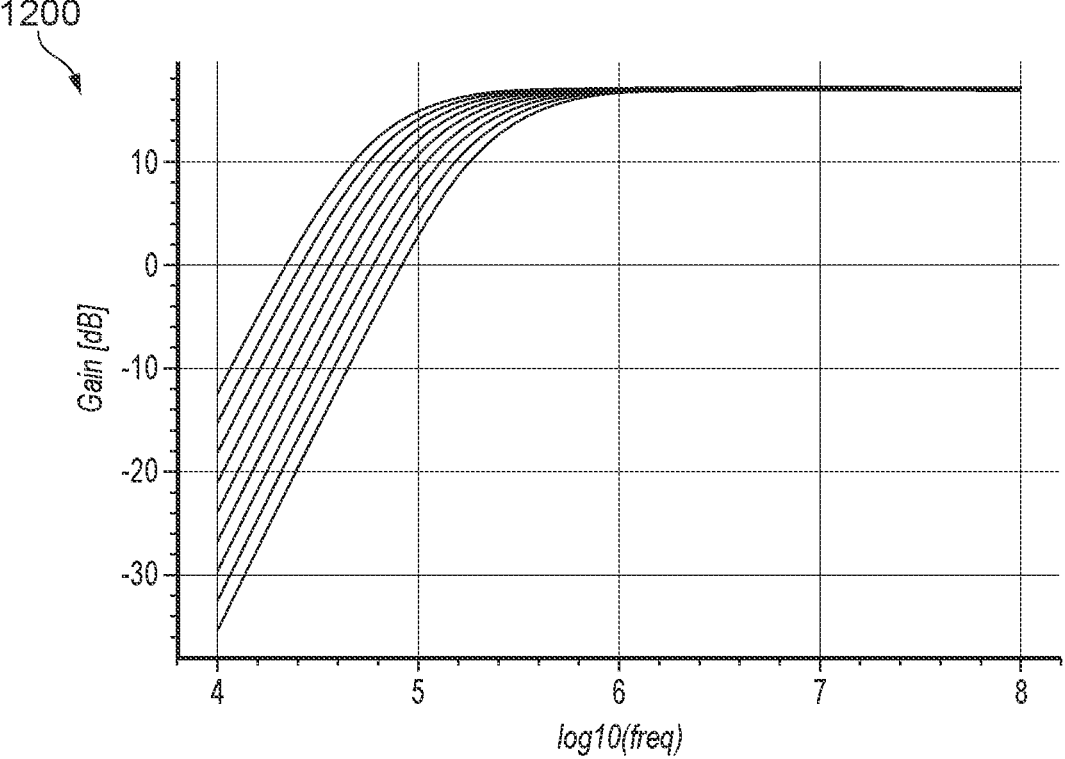
FIG. 12 shows another diagram illustrating the change in high pass filter cut off frequency for different programming codes.

It is noted that Cin1, Cf1, etc. are the analog quantities of the corresponding components shown in FIG. 2. More specifically, FIGS. 7 to 10 show step-by-step, in a bottom-up approach, how the presently disclosed active RC-type filter may meet given requirements (i.e., having a programmable gain and cut-off corner as shown in FIG. 11 and FIG. 12). For instance, it can be seen that the analog component's (e.g. Rf1) quantity (Rf1) responds to a digital code as expected. This analog quantify then further determines the transfer function of the filter, through Eq. 8 and Eq. 9.

FIG. 11 shows a diagram illustrating the magnitude of the filter transfer function 1000 as function of frequency for different programming codes that alter the amount of gain. In particular, the diagram illustrates the effect of modulating the maximum value or gain of the transfer function of |V_AMP1/Vin| by sweeping the code to the component Cin1. The codes to Cin1 are set to have an interval of 15 as an example to avoid the curves overlapping each other. It shows that the maximum gain is modulated by the value of Cin1.

FIG. 12 shows a diagram illustrating the change in high pass filter cut off frequency 1100 for different programming codes. In particular, the diagram illustrates the effect of modulating the high-pass cut-off corner of the transfer function of |V_AMP1/Vin| by sweeping the code to the component Cf1. The codes to Cf1 are set to have an interval of 10 as an example to avoid the curves overlapping each other. It is noted that the cut-off corner is modulated by the value of Cf1. The skilled person will appreciate that, in addition to modulating the gain and the cut-off corner, modulating the phase is also possible. As shown in equations 2 and 3, the ϕ(Vout) is a function of all the components. Thus, when enabling a fine control on individual components, modulating the phase is also possible in need of cancelling out phase mismatch between receiver channels. It is noted that, when for instance the circuitry shown in FIG. 2 is used, the phase and magnitude of the in-to-out transfer are tied together and the phase cannot be changed unless also the magnitude will change and vice versa. Furthermore, it is noted that the phase could be changed independently by adding a phase shifting circuit. Without such a phase shifting circuit, the phase response can be fined tuned if the accompanying magnitude change is sufficiently small to be negligible.

FIG. 13 shows an illustrative embodiment of a calibration sequence 1200. In particular, it is shown how the different components of the active RC-type filter shown in FIG. 2 can be calibrated. The calibration sequence is based on the following derivations based on the transfer function. The transfer function can be represented by equation 4. Furthermore, equation 4 can be further specified as shown in equations 5 and 6. Furthermore, equation 5 can be rewritten as equation 7. Finally, equations 8 and 9 show how two parameters appearing in equation 7 are obtained.

$$\left|\frac{Vout}{Vin}\right| = \left|\frac{V\_AMP1}{Vin}\right| \cdot \left|\frac{Vout}{V\_AMP1}\right| \tag{Eq. 4}$$

$$\frac{V\_AMP1}{Vin} = \frac{Cin1}{Cf1} \cdot \frac{j\omega \cdot Cf1 \cdot Rf1}{1 + j\omega \cdot Cf1 \cdot Rf1}. \tag{Eq. 5}$$

$$\frac{Vout}{V\_AMP1} = \left\{\frac{1}{1 + j\omega \cdot Cin2 \cdot Rlpf}\right\} \cdot \left\{\frac{Cin2}{Cf2} \cdot \frac{j\omega \cdot Cf2 \cdot Rf2}{1 + j\omega \cdot Cf2 \cdot Rf2}\right\}. \tag{Eq. 6}$$

$$\left|\frac{V\_AMP1}{Vin}\right|^2 = G\_AMP1^2 \cdot \frac{f^2}{fHP\_3dB\_stage1^2 + f^2}, \tag{Eq. 7}$$

$$G\_AMP1 = \frac{Cin1}{Cf1}, \tag{Eq. 8}$$

$$fHP\_3dB\_stage1 = \frac{1}{2\pi \cdot Cf1 \cdot Rf1}. \tag{Eq. 9}$$

Although Cf1 affects both the maximum gain and cut-off corner of the transfer function in equation 5, the gain and cut-off corner can be independently set, as Eq. 8 and Eq. 9 show. Therefore, a proper calibration sequence may be followed so that after a metric is calibrated, it is locked and the processes moves on to calibrating the next metric. The complete flow of calibrating fHP_3dB_stage1, G_dB_stage1, fHP_3dB_stage2, G_dB_stage2 and fLP_3dB_stage2 is shown in FIG. 13. The components in the transfer function represented by equation 4 should be calibrated after the components in equation 3, because locking Cin2 is a prerequisite before starting calibrating the last metric fLP_3dB_stage2.

Figure 14:
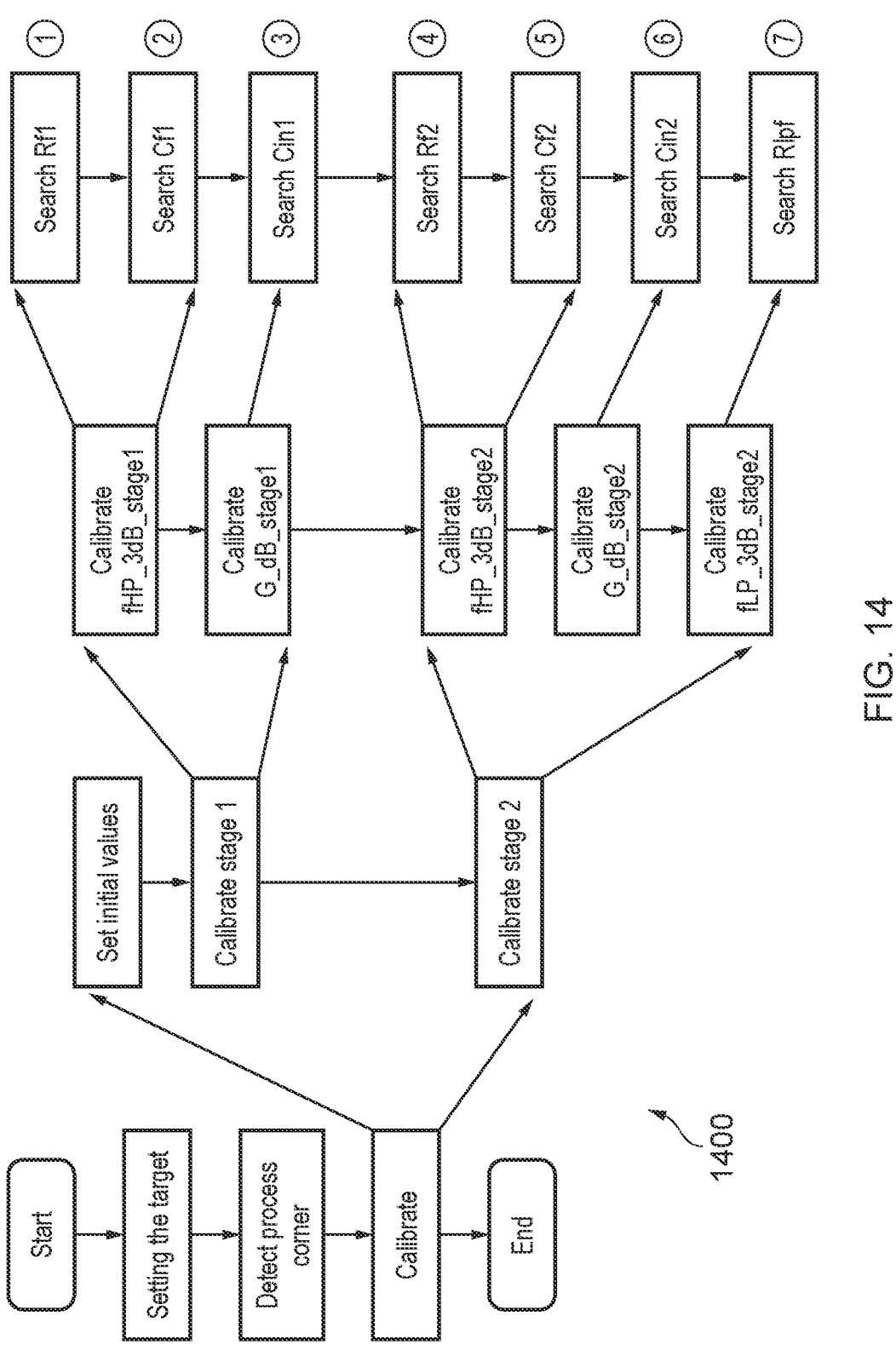
FIG. 14 shows another illustrative embodiment of a calibration sequence.

FIG. 14 shows another illustrative embodiment of a calibration sequence 1400. In particular, FIG. 14 shows the calibration sequence illustrated in FIG. 13 in a schematic form. After the sequence 1400 has started, a target is set and a process corner is detected. The calibration includes setting initial values of the amplifier parameters and calibrating the first amplifier and the second amplifier by calibrating said parameters. The parameters of the first amplifier (fHP_3dB_stage1, G_dB_stage1) are calibrated by searching for optimal values for the resistor bank Rf1, the capacitor bank Cf1 and the capacitor Cin1. The parameters of the second amplifier (fHP_3dB_stage2, G_dB_stage2, fLP_3dB_stage2) are calibrated by searching for optimal values for the resistor bank Rf2, the capacitor bank Cf2, the capacitor Cin2 and the resistor Rlpf.

Figure 15:
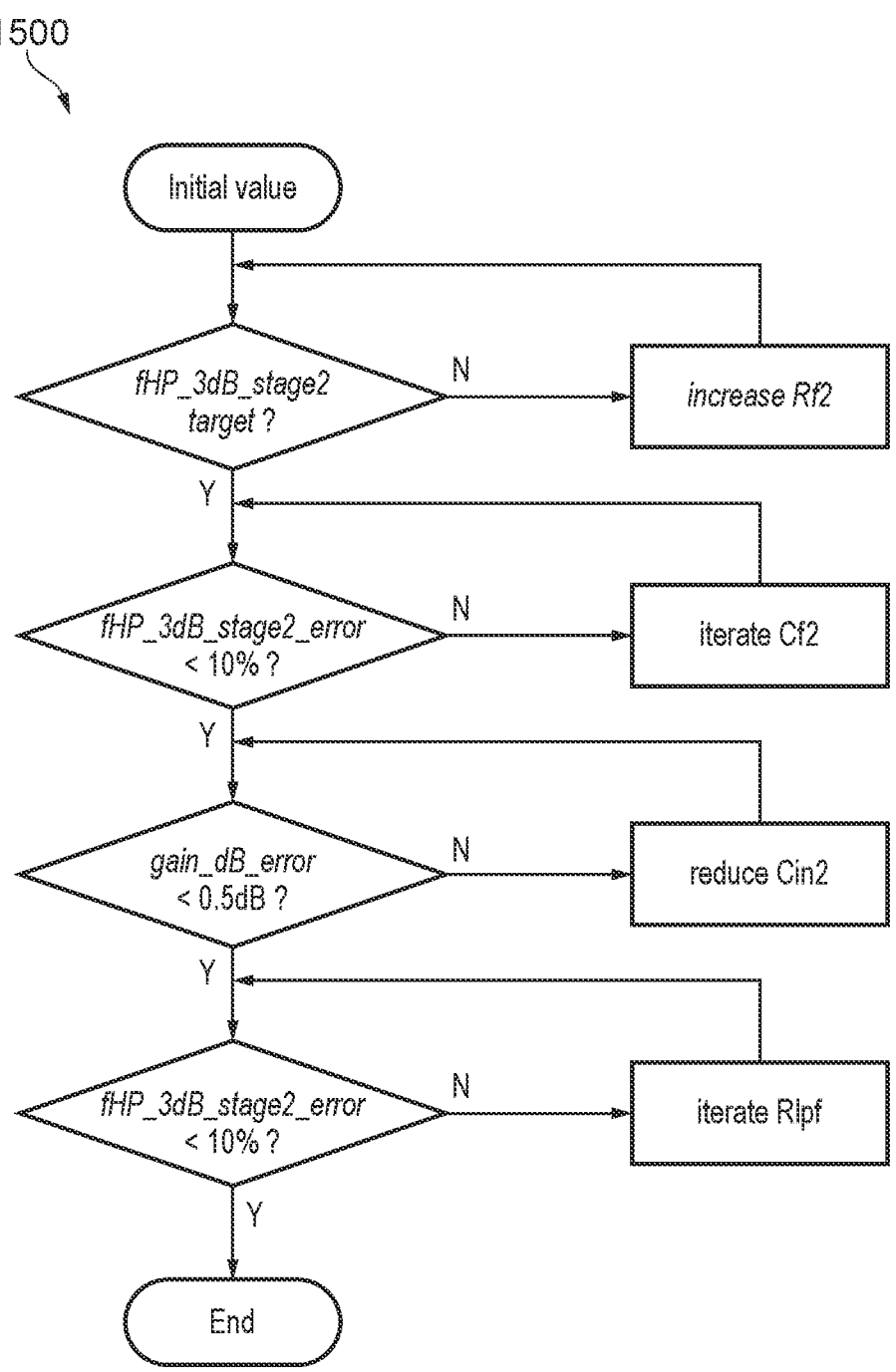
FIG. 15 shows an illustrative embodiment of a calibration process.

FIG. 15 shows an illustrative embodiment of a calibration process 1300. In particular, FIG. 15 shows in more detail how the second amplifier can be calibrated. It is noted that the calibration of the first amplifier is similar, but simpler. More specifically, FIG. 15 shows a detailed flow chart for calibrating the transfer function in equation 6. It is noted that the following initialization values may be assigned: code_Cin2=f−1(Cin2==max(Cin2)), code_Cf2=f−1

(Cf2==Cin2/G_AMP2_target), code_Rf2=f−1(Rf2==min (Rf2)), and code_Rlpf=f−1(Rlpf==min(Rlpf)).

It is noted that the embodiments above have been described with reference to different subject-matters. In particular, some embodiments may have been described with reference to method-type claims whereas other embodiments may have been described with reference to apparatus-type claims. However, a person skilled in the art will gather from the above that, unless otherwise indicated, in addition to any combination of features belonging to one type of subject-matter also any combination of features relating to different subject-matters, in particular a combination of features of the method-type claims and features of the apparatus-type claims, is considered to be disclosed with this document.

Furthermore, it is noted that the drawings are schematic. In different drawings, similar or identical elements are provided with the same reference signs. Furthermore, it is noted that in an effort to provide a concise description of the illustrative embodiments, implementation details which fall into the customary practice of the skilled person may not have been described. It should be appreciated that in the development of any such implementation, as in any engineering or design project, numerous implementation-specific decisions must be made in order to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill.

Finally, it is noted that the skilled person will be able to design many alternative embodiments without departing from the scope of the appended claims. In the claims, any reference sign placed between parentheses shall not be construed as limiting the claim. The word "comprise(s)" or "comprising" does not exclude the presence of elements or steps other than those listed in a claim. The word "a" or "an" preceding an element does not exclude the presence of a plurality of such elements. Measures recited in the claims may be implemented by means of hardware comprising several distinct elements and/or by means of a suitably programmed processor. In a device claim enumerating several means, several of these means may be embodied by one and the same item of hardware. The mere fact that certain measures are recited in mutually different dependent claims does not indicate that a combination of these measures cannot be used to advantage.

LIST OF REFERENCE SIGNS 100 discretely variable capacitor
102 discretely variable resistor
200 active RC-type filter
202 signal path
204 capacitor
206 resistor bank
208 capacitor bank
210 capacitor
212 resistor
214 resistor bank
216 capacitor bank
218 input
220 fixed gain amplifier
222 fixed gain amplifier
224 output 300 resistor bank
302 signal path
304 resistors
306 ideal switches
308 fixed gain amplifier
400 resistor bank
402 signal path
404 resistors
406 MOS switches
408 fixed gain amplifier
500 resistor bank
502 resistor ladder
504 resistor ladder
506 resistor ladder
508 fixed gain amplifier
600 ordinary switch in an off state
602 ordinary switch in an on state
604 T-switch in an off state
606 T-switch in an on state
700 dependency between a programming code and a resistor bank value
800 dependency between a programming code and a capacitor bank value
900 dependency between a programming code and a capacitor bank value
1000 dependency between a programming code and a resistor bank value
1100 filter transfer function magnitude as function of frequency
1200 change in high pass filter cut off frequency
1300 calibration sequence
1400 calibration sequence
1500 calibration process

The invention claimed is:
1. An active RC-type filter, comprising:
an input, an output and a signal path between said input and output;
at least one capacitor bank and at least one resistor bank, wherein said capacitor bank and resistor bank are integrated into the signal path;
wherein the resistor bank comprises a plurality of resistor ladders;
wherein each one of said resistor ladders comprises a plurality of resistors connected in series;
wherein each one of said resistors has an input node configured to be coupled selectively to the signal path through one of a plurality of controllable switches; and
wherein said resistor ladders have output nodes directly coupled to each other and to the signal path;
a first amplifier, a first capacitor bank coupled to an input and output of the first amplifier, and a first resistor bank coupled to said input and output of the first amplifier;
a second amplifier, a second capacitor bank coupled to an input and output of the second amplifier, and a second resistor bank coupled to said input and output of the second amplifier;
a third resistor bank coupled between the output of the first amplifier and the input of the second amplifier;
a third capacitor bank coupled between the output of the first amplifier and the input of the second amplifier;
a calibration controller configured to calibrate the first amplifier by:
performing a first coarse grid calibration of the first resistor bank of the first amplifier, after performing the first coarse grid calibration, performing a first fine grid calibration of the first capacitor bank of the first amplifier, after performing the first fine grid calibration, performing a second coarse grid calibration of the second resistor bank of the second amplifier, after performing the second coarse grid calibration, performing a second fine grid calibration of the second capacitor bank of the second amplifier, after performing the second fine grid calibration, calibrating the third capacitor bank, and after calibrating the third capacitor bank, calibrating the third resistor bank.

2. The active RC-type filter of claim 1, wherein one or more of the plurality of controllable switches are implemented as T-switches.

3. The active RC-type filter of claim 1, wherein the input of the active RC-type filter is coupled to an output of a mixer and wherein the output of the active RC-type filter is coupled to an input of an analog-to-digital converter.

4. The active RC-type filter of claim 3, said active RC-type filter being an intermediate frequency, IF, active RC-type filter configured to receive an IF signal from the mixer.

5. A frequency-modulated continuous wave radar device, comprising the active RC-type filter of claim 1.

6. A method of implementing an integrated circuit, the method comprising:

providing the integrated circuit with an active RC-type filter, providing the active RC-type filter with an input, an output and a signal path between said input and output;

providing the active RC-type filter with at least one capacitor bank and at least one resistor bank, wherein said capacitor bank and resistor bank are integrated into the signal path, and the capacitor bank is a variable capacitor bank and the resistor bank is a variable resistor bank;

wherein the resistor bank comprises a plurality of resistor ladders;

wherein each one of said resistor ladders comprises a plurality of resistors connected in series;

wherein each one of said resistors has an input node configured to be coupled selectively to the signal path through one of a plurality of controllable switches; and wherein said resistor ladders have output nodes directly coupled to each other and to the signal path;

providing the integrated circuit with a calibration controller;

providing a first amplifier with a first capacitor bank coupled to an input and output of the first amplifier, and a first resistor bank coupled to said input and output of the first amplifier;

providing a second amplifier with a second capacitor bank coupled to an input and output of the second amplifier, and a second resistor bank coupled to said input and output of the second amplifier;

providing a third resistor bank coupled between the output of the first amplifier and the input of the second amplifier;

providing a third capacitor bank coupled between the output of the first amplifier and the input of the second amplifier;

performing a first coarse grid calibration of the first resistor bank of the first amplifier, after performing the first coarse grid calibration, performing a first fine grid calibration of the first capacitor bank of the first amplifier, after performing the first fine grid calibration, performing a second coarse grid calibration of the second resistor bank of the second amplifier, after performing the second coarse grid calibration, performing a second fine grid calibration of the second capacitor bank of the second amplifier, after performing the second fine grid calibration, calibrating the third capacitor bank, and after calibrating the third capacitor bank, calibrating the third resistor bank.

7. The method of claim 6, wherein the integrated circuit is for use in radar applications.

* * * * *